United States Patent
Nozuyama

(10) Patent No.: US 7,162,674 B2
(45) Date of Patent: Jan. 9, 2007

(54) APPARATUS FOR SELECTING TEST PATTERNS FOR LOGIC CIRCUIT, COMPUTER IMPLEMENTED METHOD FOR SELECTING TEST PATTERNS, AND COMPUTER PROGRAM PRODUCT FOR CONTROLLING A COMPUTER SYSTEM SO AS TO SELECT TEST PATTERNS

(75) Inventor: Yasuyuki Nozuyama, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 425 days.

(21) Appl. No.: 10/678,975

(22) Filed: Oct. 2, 2003

(65) Prior Publication Data

US 2004/0133833 A1 Jul. 8, 2004

(30) Foreign Application Priority Data

Oct. 3, 2002 (JP) ............................. 2002-291442

(51) Int. Cl.
*G01R 31/28* (2006.01)
(52) U.S. Cl. ........................................ 714/741; 714/33
(58) Field of Classification Search ................ None
See application file for complete search history.

(56) References Cited

U.S. PATENT DOCUMENTS

| | | | |
|---|---|---|---|
| 4,769,817 A * | 9/1988 | Krohn et al. ................ 714/33 |
| 5,414,716 A * | 5/1995 | Bershteyn .................. 714/738 |
| 5,771,243 A * | 6/1998 | Lee et al. ................... 714/738 |
| 6,308,293 B1 * | 10/2001 | Shimono .................... 714/741 |
| 6,567,946 B1 | 5/2003 | Nozuyama ................. 714/741 |
| 2001/0027539 A1 | 10/2001 | Nozuyama ................... 714/33 |

FOREIGN PATENT DOCUMENTS

| | | |
|---|---|---|
| JP | 401088266 A * | 4/1989 |
| JP | 06-201791 | 7/1994 |
| JP | 07-055895 | 3/1995 |
| JP | 09-145800 | 6/1997 |
| JP | 09-264938 | 7/1997 |
| JP | 11-052030 * | 2/1999 |
| JP | 2000-276500 * | 10/2000 |
| JP | 2001-273160 * | 10/2001 |

OTHER PUBLICATIONS

The Official Action Letter issued on Mar. 7, 2006 regarding the counterpart Japanese Patent Application No. 2002-291442.
Y. Nozuyama, et al., "A Method For Estimating And Enhancing Test Quality Using Layout Information —A Basic Method and A Few Examples (Bridge Fault Iddq Test, Weighted Stuck-at Fault Coverage)-", Technical Report of IEICE (Japan), vol. CPM 2002-152, ICD2002-197, The Institute Of Electronics, Information And Communications Engineers), (Jan. 2003).

* cited by examiner

*Primary Examiner*—Guy Lamarre
*Assistant Examiner*—John P. Trimmings
(74) *Attorney, Agent, or Firm*—DLA Piper US LLP

(57) ABSTRACT

An apparatus for selecting test patterns in accordance with an embodiment of the present invention has a first test pattern selecting module configured to define selected test patterns and unselected test patterns, a fault simulation module configured to simulate whether test patterns detect faults, a weighting module configured to add a weight to each of the first undetected faults, a fault sampling module configured to extract second undetected faults from the first undetected faults to which the added weights are given, and a second test pattern selecting module configured to extract additionally selected test patterns based on the added weight.

14 Claims, 7 Drawing Sheets

APPARATUS FOR SELECTING TEST PATTERNS FOR LOGIC CIRCUIT, COMPUTER IMPLEMENTED METHOD FOR SELECTING TEST PATTERNS, AND COMPUTER PROGRAM PRODUCT FOR CONTROLLING A COMPUTER SYSTEM SO AS TO SELECT TEST PATTERNS

CROSS REFERENCE TO RELATED APPLICATIONS

This application is based upon and claims the benefit of priority from prior Japanese Patent Application P2002-291442 filed on Oct. 3, 2002; the entire contents of which are incorporated by reference herein.

BACKGROUND OF THE INVENTION

1. Field of the Invention

The present invention relates to an apparatus and a computer implemented method for selecting test patterns and a computer product program for controlling a computer system so as to select test patterns and in particular to a fault simulation technology of a large scale integrated circuit (LSI) so as to reduce the number of test patterns effectively by using a fault coverage reflecting layout information correlating with quality of the LSI.

2. Description of the Related Art

In manufacturing tests, LSI chips are inspected to ensure that the LSI chips have no defects. The manufacturing tests employ test patterns for detecting faults that possibly occur in internal circuit of an LSI. Since a fault coverage of each of the test patterns is an important factor in such manufacturing tests, the fault coverage of each of the test patterns is previously evaluated by fault simulation.

When a logic circuit of an LSI is designed, multiple verification patterns are used to verify the function of the logic circuit. Such verification patterns for designing the logic circuit are converted to the test patterns in the manufacturing tests. However, since the chip gate count increases in accordance with enlarging degree of on-chip integration of the LSI recently, the fault simulation with all verification patterns requires tremendous CPU resources. Therefore, converting all verification patterns to the test patterns causes increased costs of the manufacturing tests and reducing the number of verification patterns converted to the test patterns is desired.

A method for reducing the number of test patterns without decreasing the fault coverage is proposed in published Japanese Patent Application P2001-273160. According to the proposed method, verification functional coverage of each verification pattern for register transfer level (RTL) description of the LSI is evaluated. Subsequently, the minimum verification patterns equivalent to all verification patterns in functional verification coverage or RTL code coverage are extracted and defined as a "selected test pattern set". In contrast, other verification patterns are defined as an "unselected test pattern set". Thereafter, the fault simulation generates a "first undetected fault list" including faults that are undetected by the selected test pattern set in the logic circuit. Further, a "second undetected fault list" is generated by extracting faults from the first undetected fault list by random. Thereafter, whether each of the unselected test pattern set detects the faults included in the second undetected fault list is determined and "detected fault list by the unselected test pattern" is generated. Based on the detected fault lists by the unselected test patterns, the verification patterns contributing to increase the fault coverage are extracted from the unselected test pattern set and are defined as an "additionally selected test pattern set". In this manner, the selected test pattern set and the additionally selected test pattern set are extracted from the verification patterns and are consequently employed to test the LSI chips in the manufacturing tests.

In addition, a method for adding a weight reflecting layout information on circuit elements to each fault is proposed in published Japanese Patent Application P2000-276500. Such weight is calculated by referring to logic connection nodes and layout information of the circuit.

In the method for reducing test patterns described above, procedure for extracting the selected test pattern set based on the functional verification coverage by functional verification coverage evaluating tools and procedure for selecting the additionally selected test pattern set based on the fault coverage by fault simulating tools are connected effectively. In this manner, the total test patterns employed in the manufacturing tests are reduced without or negligibly small decrease of the fault coverage.

However, the faults based on a fault model used in this method only reflect logical definition of internal connection nodes of the logic circuit or input/output (I/O) terminals of basic cells and do not reflect information of layout of the elements, such as length of wires, length of closely placed part of wire pairs, area of basic cells, length of closely placed part of wire pairs and the number of minimum size contacts, correlating to real defects in the LSI chips. Consequently, the verification patterns failing to effectively detect the real defects may be more selected as the additional selected test patterns, which causes longer manufacturing tests time, compared with the case in which layout information is taken into account.

SUMMARY OF THE INVENTION

An aspect of present invention inheres in an apparatus for selecting test patterns according to an embodiment of the present invention comprising a first test pattern selecting module configured to classify a plurality of verification patterns of a logic circuit of an LSI into a plurality of selected test patterns fulfilling a reliability criterion and a plurality of unselected test patterns failing to fulfill the reliability criterion, a fault simulation module configured to simulate whether the plurality of selected test patterns and the plurality of unselected test patterns detect a plurality of faults estimated to occur in the logic circuit, a weighting module configured to add a weight reflecting a plurality of layout elements of the logic circuit to each of a plurality of first undetected faults that are undetected by the plurality of selected test patterns and define the plurality of first undetected faults to which the weight are added as a plurality of first weighted undetected faults, a fault sampling module configured to extract a plurality of second undetected faults from the plurality of first weighted undetected faults, and a second test pattern selecting module configured to extract a plurality of additionally selected test patterns that detects complementarily the plurality of second undetected faults from each other from the plurality of unselected test patterns based on a criterion of the weight.

Another aspect of the present invention inheres in a computer implemented method for selecting test patterns according to an embodiment of the present invention comprising classifying a plurality of verification patterns of a logic circuit of an LSI into a plurality of selected test patterns fulfilling a reliability criterion and a plurality of unselected test patterns failing to fulfill the reliability criterion, simulating whether the plurality of selected test patterns detects a plurality of faults estimated to occur in the logic circuit, adding a weight reflecting a plurality of layout elements of the logic circuit to each of a plurality of first undetected faults that are undetected by the plurality of selected test patterns and defining the plurality of first undetected faults to which the weights are added as a plurality of first weighted undetected faults, extracting a plurality of second undetected faults from the plurality of the first weighted undetected faults based on an extracting condition, simulating whether the plurality of the unselected test patterns detects the plurality of second undetected faults, and extracting a plurality of additionally selected test patterns that detects complementarily the plurality of the second undetected faults from each other from the plurality of the unselected test patterns based on a criterion of the added weight.

Yet another aspect of the present invention inheres in a computer program product for controlling a computer system so as to select test patterns according to an embodiment of the present invention comprising instructions configured to classify a plurality of verification patterns of a logic circuit of an LSI into a plurality of selected test patterns fulfilling a reliability criterion and a plurality of unselected test patterns failing to fulfill the reliability criterion within the computer system, instructions configured to simulate whether the plurality of selected test patterns detects a plurality of faults estimated to occur in the logic circuit within the computer system, instructions configured to add a weight reflecting a plurality of layout elements of the logic circuit to each of a plurality of first undetected faults that are undetected by the plurality of selected test patterns and define the plurality of first undetected faults to which the weights are added as a plurality of first weighted undetected faults within the computer system, instructions configured to extract a plurality of second undetected faults from the plurality of first weighted undetected faults based on an extracting condition within the computer system, instructions configured to simulate whether the plurality of the unselected test patterns detects the plurality of second undetected faults within the computer system, and instructions configured to extract a plurality of additionally selected test patterns that detects complementarily the plurality of the second undetected faults from each other from the plurality of unselected test patterns based on a criterion of the added weight within the computer system.

DETAILED DESCRIPTION OF THE INVENTION

Figure 1:
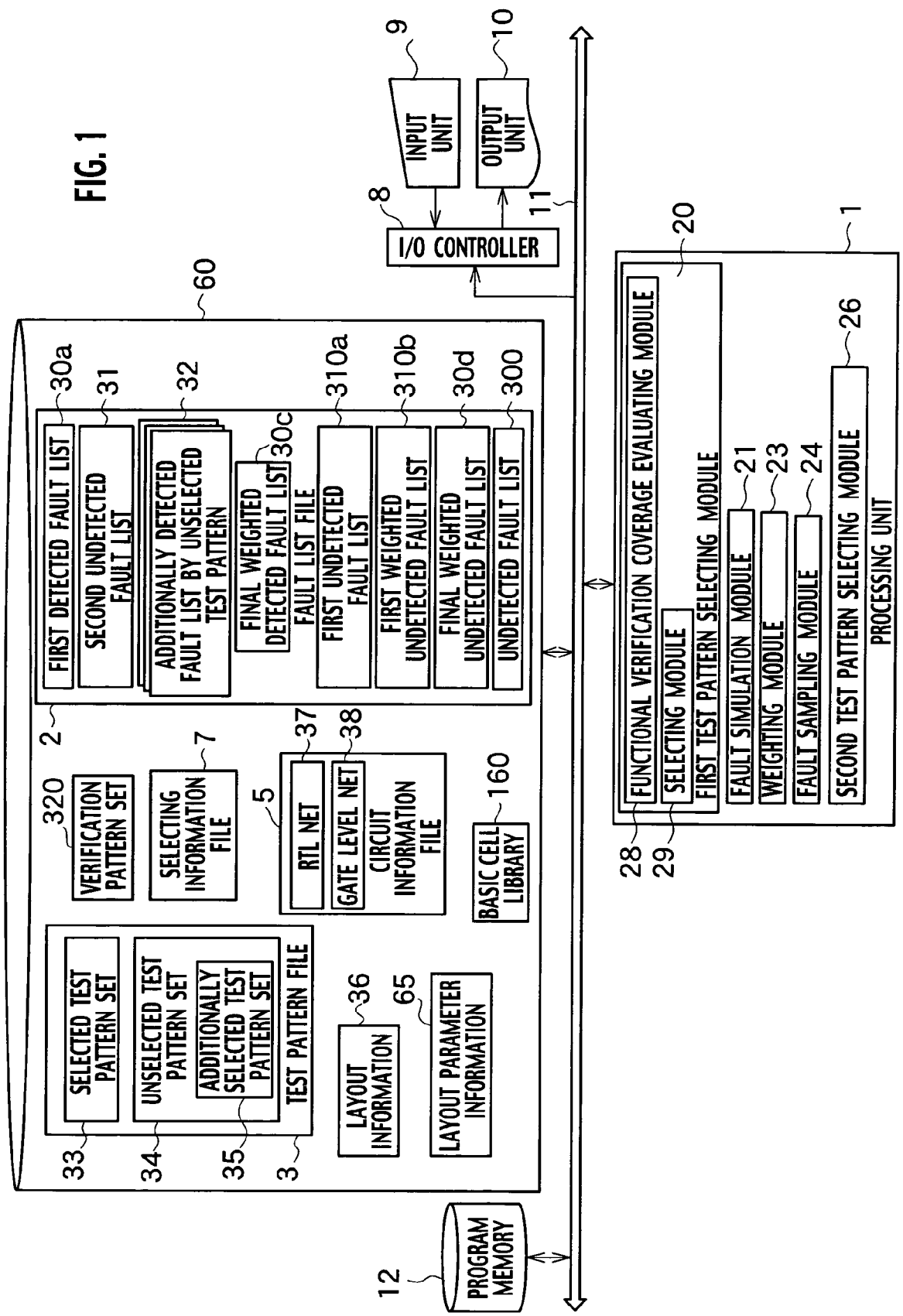
FIG. 1 is a block diagram of an apparatus for selecting test patterns in accordance with an embodiment of the present invention.

An embodiment of the present invention will be described with reference to the accompanying drawings. It is to be noted that the same or similar reference numerals are applied to the same or similar parts and elements throughout the drawings, and the description of the same or similar parts and elements will be omitted or simplified.

With reference now to FIG. 1, an apparatus for selecting test patterns has a processing unit 1, a data memory 60 and a program memory 12 which are connected to the processing unit 1 through a data transfer bus 11. The processing unit 1 has a first test pattern selecting module 20, a fault simulation module 21, a weighting module 23, a fault sampling module 24 and a second test pattern selecting module 26. A central processing unit (CPU) is available for the processing unit 1 and computer hardware units or software executing equivalent function on the CPU is available for the first test pattern selecting module 20, the fault simulation module 21, the weighting module 23, the fault sampling module 24 and the second test pattern selecting module 26.

The data memory 60 saves a verification pattern set 320, a faults list file 2, a test pattern file 3, layout information 36, layout parameter information 65, a circuit information file 5, a basic cell library 160 and a selecting information file 7. The program memory 12 saves program commands to operate the processing unit 1. Semiconductor memory devices such as a read only memory (ROM), a random access memory (RAM), a magnetic disk unit, a magnetic drum device and a magnetic tape unit are available for the data memory 60 and the program memory 12.

The verification pattern set 320 includes a plurality of verification patterns to verify functions of a logic circuit when an LSI is designed. The circuit information file 5 includes RTL net 37 and gate level net 38. The RTL net 37 is information on logic connection net of the RTL of the logic circuit and the gate level net 38 is information on gate level logic connection net relating to the I/O terminals and electric wires. The "logic circuit" can be interpreted as either the entire logic circuit of the LSI or the internal logic circuit of function blocks in the LSI in this embodiment. The layout information 36 is obtained as a result of arrangement of the basic cells in the LSI by an automatic arrangement wiring tool and connecting with the electric wires between I/O terminals of the basic cells and I/O terminals of an LSI. The layout information 36 may additionally include information about internal layout of the basic cells. The layout parameter information 65 is that on layout elements or combination of the elements possibly having a strong correlation with faults possibly occurring in logic connection nodes and the I/O terminals included in the layout information 36, for example, the length of wires, the length of closely placed part of neighboring wire pairs, area of basic cells, and the number of minimum size contacts. The selecting information file 7 includes selecting information "r". The details of selecting information "r" are described below along with an explanation of a candidate test pattern selecting module 52 with reference to FIG. 3.

The first test pattern selecting module 20 in the processing unit 1 has a functional verification coverage evaluating module 28 and a selecting module 29. The functional verification coverage evaluating module 28 evaluates functional verification coverage and a fault coverage of the verification pattern included in the verification pattern set 320. The selecting module 29 extracts verification patterns from the verification pattern set 320 based on a reliability criterion. The reliability criterion includes the functional verification coverage and the fault coverage evaluated by the functional verification coverage evaluating module 28. The first test pattern selecting module 20 classifies the verification pattern extracted by the selecting module 29 into a selected test pattern. A selected test pattern set 33 including a plurality of selected test patterns is saved in the test pattern file 3. In addition, the first test pattern selecting module 20 classifies the verification pattern that is not extracted by selecting module 29 into an unselected test pattern. The unselected test pattern set 34 including a plurality of unselected test patterns is saved in the test pattern file 3. The "function verification coverage" is a criterion to verify how much the verification pattern inspects the RTL description of the logic circuit in the LSI. The functional verification coverage is classified into statement coverage, branch coverage, condition coverage and toggle coverage. The statement coverage identifies areas of untested or dead description. The branch coverage helps to identify control logic problems in the description such as untested or redundant branch operations. The condition coverage highlights problems with control variable values, control logic operators and helps to identify untested or redundant branching operations. The toggle coverage highlights problems with activation of signals in the logic circuits. "The fault coverage" is a ratio of detected faults by the verification pattern to all possible faults in the logic circuit. The functional verification coverage evaluating tools on the market are available for the functional verification coverage evaluating module 28, and the verification pattern selecting tools on the markets are also available for the selecting module 29. The selected test pattern set 33 is almost equivalent to the verification pattern set 320 in the functional verification coverage. If the functional verification coverage of the selected test pattern set 33 about the RTL net 37 is almost 100%, a high fault coverage about the gate level net 38 is also expected.

The processing unit 1 accesses the gate level net 38 and the fault simulation module 21 generates a list of faults of a fault model that can be assumed in the logic circuit. The processing unit 1 saves the list of faults in the fault list file 2 as a undetected fault list 300. The "fault model" includes a single net stuck-at fault model and a single pin stuck-at fault model. The "single net stuck-at fault model" presumes that the value of a connection node in gate level net 38 is fixed to 0 or 1. The "single pin stuck-at fault model" presumes that the value of the I/O terminal of the basic cell in the LSI is fixed to 0 or 1. The number of the single net stuck-at fault model is 2 *A, here A is the number of connection nodes. The number of the single pin stuck-at fault model is 2 *B, here B is the total number of I/O terminals of the basic cells and the LSI. Though fault simulation of the gate level net 38 is described in this embodiment, the fault simulation of the gate level net including the internal connection net of circuit elements is also available. In addition, the processing unit 1 accesses the gate level net 38 and the basic cell library 160 and the fault simulation module 21 simulates whether the selected test patterns included in the selected test pattern set 33 detect the faults included in the undetected fault list 300. The processing unit 1 saves first detected faults detected by the selected test pattern set 33 in the fault list file 2 as a first detected fault list 30a. The processing unit 1 simultaneously saves first undetected faults that are undetected by the selected test pattern set 33 in the fault list file 2 as a first undetected fault list 310a. In addition, the fault simulation module 21 calculates the fault coverage from a rate of the number of first detected faults to the total number of faults included in the undetected fault list 300.

Faults as a result of the fault simulation can be classified into "hard detected fault" detected by the selected test pattern set 33, "undetected fault", "potentially detected fault", "hyperactive fault", "oscillatory fault", "redundant fault", etc. The potentially detected fault changes the fixed value of 0 or 1 to an uncertain value. The oscillatory fault causes electric oscillation in the logic circuit. Hyperactive fault induces substantial internal signal activity without reaching a primary output. If the potentially detected fault appears at some prescribed times during a fault simulation, the potentially detected fault may be classified into a possible detected fault. Therefore, the faults outputted by the fault simulation can be classified into many types, however, the first undetected faults included in the first undetected fault list 310a are basically the undetected faults. However, the hyperactive faults, the oscillatory faults or the potentially detected faults may be included in the first undetected faults to increase a reliability of the apparatus for selecting test patterns.

The weighting module 23 adds a weight to each of the first undetected faults included in the first undetected fault list 310a and defines the first undetected faults to which the weights are added as first weighted undetected faults. It may be convenient to add weights first to detected faults and then extract weights for undetected faults from uncovered layout elements. The added weight reflects the layout information 36 and the layout parameter information 65. The processing unit 1 saves a set of the first weighted undetected faults in the fault list file 2 as a first weighted undetected fault list 310b. Examples of a fault list before adding weight and a fault list added weight are shown in Table.1 and Table.2.

TABLE 1

| Before adding weight | |
|---|---|
| Fault A | D |
| Fault B | U |
| Fault C | D |

↓

After adding weight

| Fault A | D | M1__312 + M2__57 + M1__2199 | WA |
| Fault B | U | M1__15 + M2__1187 + M1__745 | WB |
| Fault C | D | M1__2935 + M2__583 + M1__1865 | WC |

TABLE 2

| Before adding weight | |
|---|---|
| Fault A | D |
| Fault B | U |
| Fault C | D |

↓

After added weight

| Fault A | D | W1A | V12__31 + V21__1782 | W2A | M1__3158 + M2__186 + | WA |

TABLE 2-continued

| | | | | | | |
|---|---|---|---|---|---|---|
| Fault B | U | W1B | V12_785 + V21_5581 | W2B | M1_1811 M1_437 + M2_2593 + M1_761 | WB |
| Fault C | D | W1C | V12_3957 + V21_833 | W2C | M1_2814 + M2_58 + M1_1527 | WC |

"D" on Table.1 and Table.2 indicates the fault is hardly detected by the fault simulation. "U" indicates the fault is undetected by the fault simulation. "Fault A" includes type of stuck-at fault and information on the name of connection node in the LSI. Type of the stuck-at fault is stuck-at 0 (SA0) fault or stuck-at 1 (SA1) fault. The name of connection node, for example "/I15/Ixyz/A[12]", reflects a hierarchy of the connection net. Information for discriminating a representative fault and equivalent faults, for example rep/eq, is additionally added to the list on occasion. The "equivalent faults" yield same fault output by the fault simulation with all verification patterns, therefore the equivalent faults are not discriminated each other. Since a number of faults such as the equivalent faults exist, a single representative fault model to be simulated is usually extracted from the equivalent faults to save the CPU resources. The equivalent faults are usually listed below the line of the representative fault in the fault list. It is desirable that the weight affect of the equivalent faults is incorporated to the value of the weight of the faults to increase reliability of the apparatus for selecting test patterns.

Each fault A, B, C on Table.1 has the added weight of WA, WB, and WC. W1A, W1B and W1C are added weight reflecting the number of the minimum-size connecting contact between metal wires and W2A, W2B and W2C are added weight reflecting the length of the metal wire on Table.2. For example, W1A corresponds to two connecting contact V12_31 and V21_1782, therefore, W1A is shown by the sum of weight of V12_31 and V21_1782. Final added weight W is also recorded in the line on Table.2. For example, the weighting module 23 calculates the added weight of the fault A by the equation of WA=x*W1A+y*W2A. Here, x and y are appropriate constant value. The faults B, C are also calculated similarly. Programming the equation in the weighting module 23 after determining the form of the equation composed of necessary layout elements by reflecting the layout parameter information 65 is an alternative. In this case, the constants in the equation can be set as parameters with the layout parameter information 65.

Figure 2:
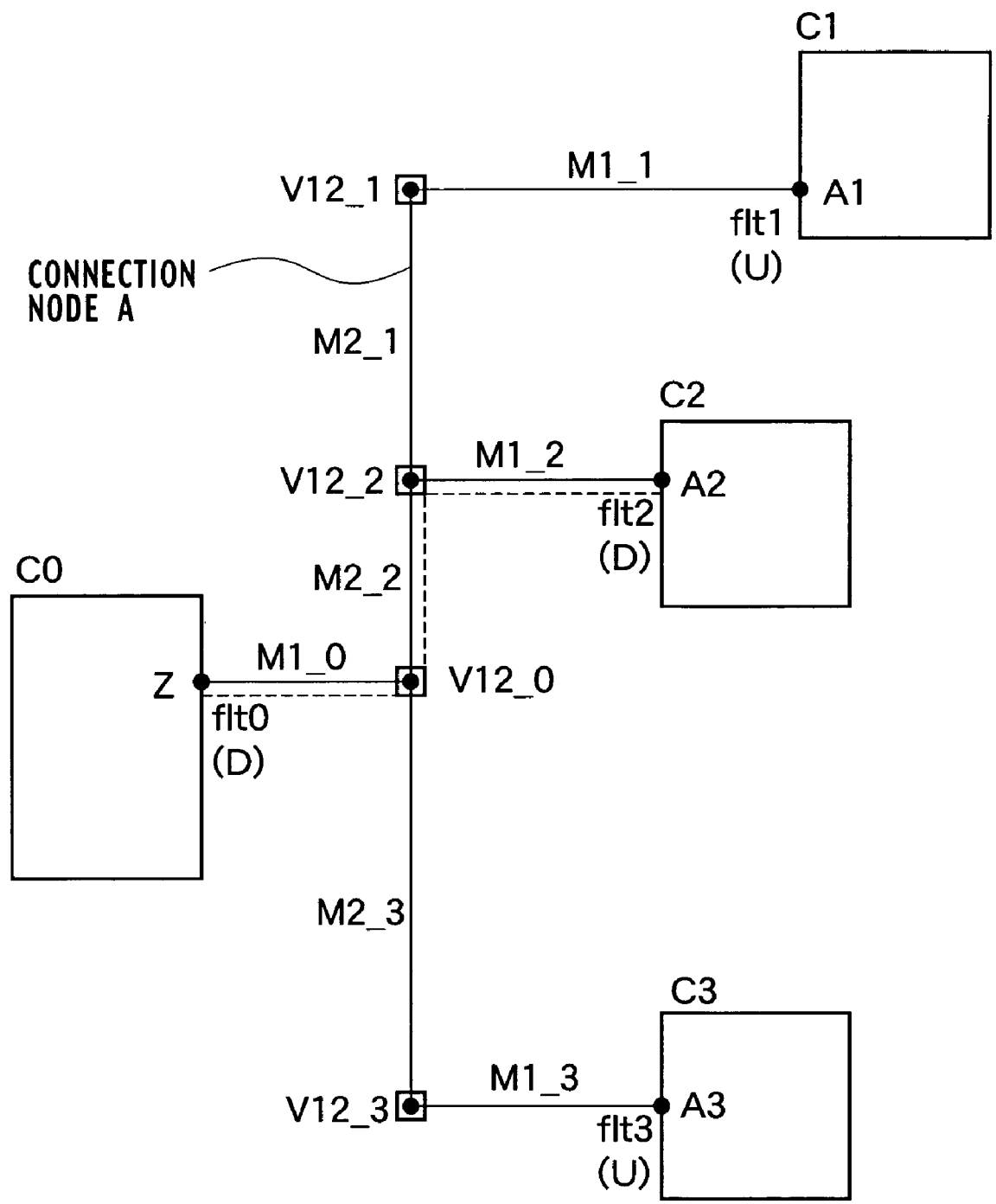
FIG. 2 is a diagram of an illustrated layout of a logic circuit in accordance with an embodiment of the present invention.

The fact that multiple faults are often related to a particular same layout element should be taken care when the weight is calculated. In FIG. 2, a basic cell C0 is connected to basic cell C1, C2, C3 through a connection node A of the electric wire. The faults "flt0", "flt1", "flt2", and "flt3" are defined in terminal Z, A1, A2, A3 of each basic cell C0, C1, C2, C3. Each fault "flt0", "flt1", "flt2", and "flt3" is the stuck-at 0 fault or the stuck-at 1 fault. The node A contains a first layer metal wire "M1_0", "M1_1", "M1_2", "M1_3", a second layer metal wire "M2_1", "M2_2", "M2_3" and the minimum sized contact "V12_0", "V12_1", "V12_2", "V12_3" connecting the first layer metal wire and the second layer metal wire. In the case the faults flt0 and flt2 are detected (D) and the faults flt1 and flt3 are undetected (U), the first layer metal wire M1_0 and M1_2, the second layer metal wire M2_2 and the contact V12_0 and V12_2 are detected, however, other layout element are undetected. Therefore, even though layout elements primarily reflected in the fault flt1 are the first layer metal wire M10 and M11, the second layer metal wire M2_2 and M2_1, the contact V12_0 and V12_1, layout elements reflected in the undetected fault flt1 are consequently restricted to the first layer metal wire M1_1, the second layer metal wire M2_1, and the contact V12_1, since the first layer metal wire M1_0 and M1_2 and the second layer metal wire M2_2 and the contact V12_0 are surely detected by detecting the faults flt0 and flt2. In the case the fault flt0 and flt3 are detected and the fault flt1 and flt2 are undetected, layout elements reflected in the undetected fault flt1 are also restricted to the first layer metal wire M1_1, the second layer M2_2 and M2_1 and the contact V12_1. In this manner, a particular layout element is possibly reflected in multiple faults Therefore, the weight reflecting a layout element and added to one undetected fault is calculated with care whether the layout element is reflected in other detected faults or not. By the way, adding the weight to the faults by an operator is the alternative to adding the weight to the fault models by the weighting module 23 with the layout parameter information 65.

The fault sampling module 24 extracts second undetected faults from a set of the first weighted undetected faults included in the first weighted undetected fault list 310b based on an extracting condition. Extracting with an extraction probability proportional to the added weight is an example of the extracting condition. The second undetected fault list 31 extracted at random is also available.

The processing unit 1 accesses the gate level net 38 and the basic cell library 160 and the fault simulation module 21 simulates whether the unselected test patterns included in the unselected test pattern set 34 detect the second undetected faults included in the second undetected fault list 31. The processing unit 1 saves among the second undetected faults detected faults by each of the unselected test patterns in the fault list file 2 as an additionally detected fault list by that of the unselected test pattern 32. Since the second undetected faults included in the second undetected fault list 31 are given the weights, the fault simulation module 21 deletes the added weight before the fault simulation, and gives added weight to faults again to output an additionally detected fault list by an unselected test pattern 32.

Figure 3:
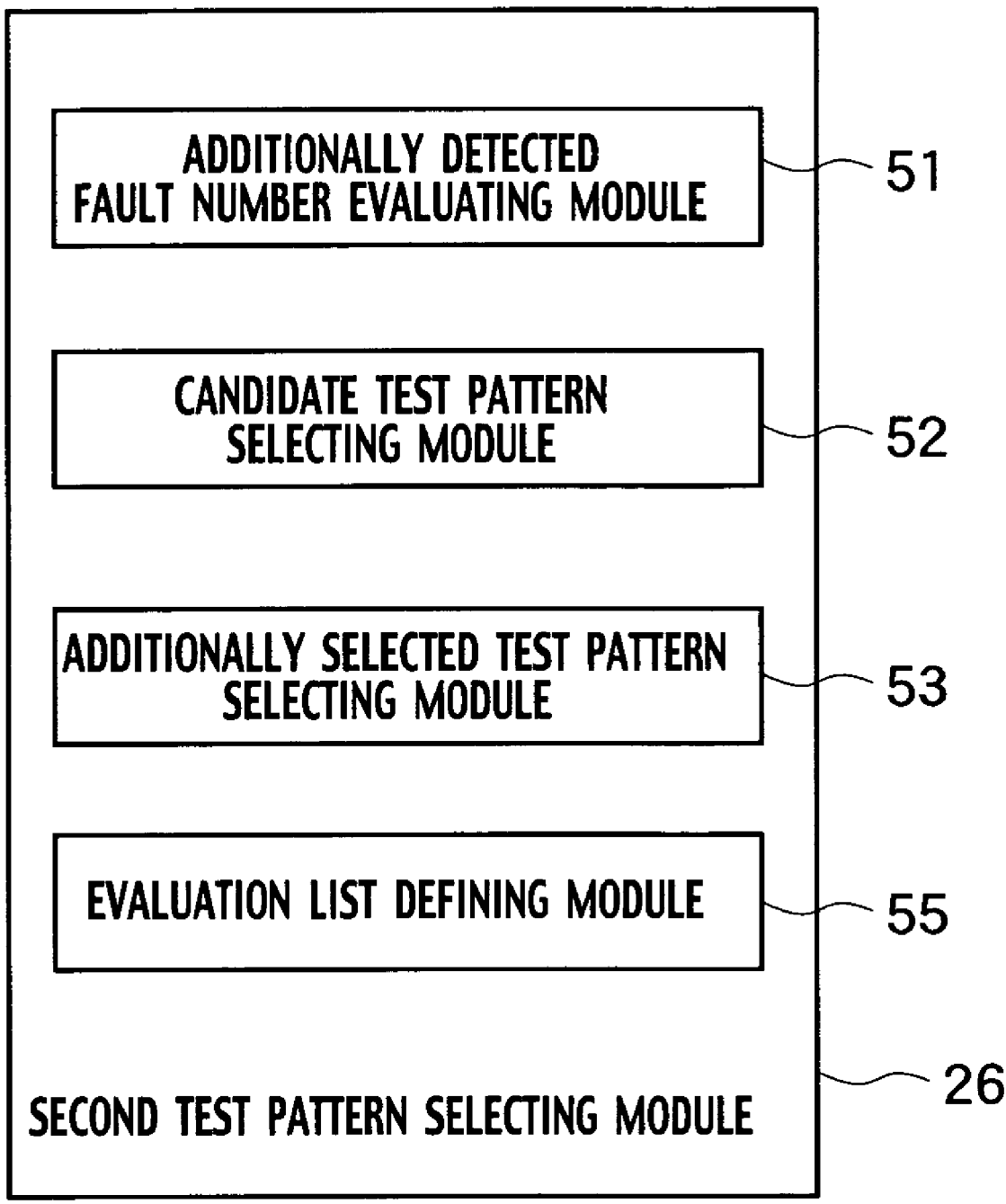
FIG. 3 is a block diagram of a second test pattern selecting unit in accordance with an embodiment of the present invention.

Turning next to FIG. 3, the second test pattern selecting module 26 has an additionally detected fault number evaluating module 51, a candidate test pattern selecting module 52, an additionally selected test pattern selecting module 53, and an evaluation list defining module 55.

The additionally detected fault number evaluating module 51 has an internal adder and defines the second undetected fault list 31 shown in FIG. 1 as an "evaluation list A0" in case of first processing. In addition, the processing unit 1 accesses the additionally detected fault lists by unselected test patterns 32 and the additionally detected fault number evaluating module 51 shown in FIG. 3 estimates the unselected test pattern detects the second undetected faults included in the evaluation list A0. After estimation, the additionally detected fault number evaluating module 51 deletes unselected test patterns that detect few or no faults or also deletes unselected test patterns by which all detected faults that are given an added weight of 0 or nearly 0.

The processing unit 1 shown in FIG. 1 accesses the additionally detected fault lists by unselected test patterns 32, the selecting information "r" stored in the selecting information file 7 and the evaluation list A0 and the candidate test pattern selecting module 52 shown in FIG. 3 calculates an evaluation value (EV) of each unselected test pattern included in the unselected test pattern set 34 by the following equations (1)–(3). The candidate test pattern selecting module 52 defines one or a plurality of unselected test patterns fulfilling a first criterion of the EV given by the following equation (4) as candidate test patterns and extracts the candidate test patterns from the unselected test pattern set 34. In addition, the candidate test pattern selecting module 52 defines a candidate test pattern indicating the maximum EV value as a "best pattern" and defines the evaluation list A0 as an "evaluation list B0".

$$EV = r*W_s + (1-r)/L_s \qquad (1)$$

Here, $W_s$ is normalized added weight of detected faults, $L_s$ is the normalized length of an undetected test pattern. $W_s$ and $L_s$ are calculated by the following equations (2) and (3).

$$W_s = W_t/W_m \qquad (2)$$

Here, Wt is sum of the total weight added to faults detected by each unselected test pattern to evaluate, $W_m$ is the maximum value among all $W_t$.

$$L_s = L_t/L_m \qquad (3)$$

Here, $L_t$ is the length of each unselected test pattern (step number) to evaluate, $L_m$ is the maximum value among all $L_t$.

$$EV \geq \alpha \qquad (4)$$

Here, α: 0<α≦1.

The selecting information "r" (0≦r≦1) is a parameter to adjust weight ratio of each of Ws and Ls in the equation (1). A large value of the selecting information "r" attaches more importance to the normalized weight of faults ($W_s$) than to the normalized length ($L_s$) of an unselected test pattern, which leads to the result that the unselected test patterns detecting faults of which total weight $W_t$ is large are selected as the candidate test patterns. However, the unselected test patterns of which each step number $L_t$ is large to induce a long test time, are possibly selected. In contrast, the unselected test patterns of which each normalized pattern length $L_s$ is small are effectively selected as the candidate test patterns by a small value of the selecting information "r". However, the number of detected faults does not increase rapidly with the number of candidate test patterns of which each step number $L_t$ is short, which requires more calculation to obtain the objective fault coverage in the second test pattern selecting module 26. Such calculation may require larger CPU resources. Therefore, the selecting information "r" is assigned to appropriate value with reference to an experimental database, for example. Each weight that is added to each of the faults is also assigned to appropriate value reflecting influences from detected faults as explained in FIG. 2.

The additionally selected test pattern selecting module 53 calculates the EV of each candidate test pattern by the equations (1)–(3). In addition, the additionally selected test pattern selecting module 53 excludes from processing candidate test patterns failing to fulfill a second criterion of the EV given by the equation (5) and defines a candidate pattern indicating the maximum EV value as the additionally selected test pattern. The additionally selected test pattern is added to an additionally selected test pattern set 35 in the test pattern file 3 shown in FIG. 1.

$$EV_c \geq \beta*(EV_b - EV_{min}) \qquad (5)$$

Here, β: 0<β≧1.

Here, $EV_c$, is the EV of each candidate test pattern to evaluate, $EV_b$ is the EV of the best pattern, and $EV_{min}$ is the minimum value of the EV. $EV_{min}$ is usually 0.

In addition, the additionally selected test pattern selecting module 53 shown in FIG. 3 erases among the second undetected faults detected faults by the additionally selected test pattern from the evaluation list B0 and surveys the existence of the candidate test patterns to be processed.

The evaluation list defining module 55 surveys the existence of the unselected test patterns that detect second undetected faults that are given effective weight. In the case of the existence of such unselected test patterns, the evaluation list defining module 55 defines the evaluation list B0 as the evaluation list A0 again.

With reference again to FIG. 1, the fault simulation module 21 simulates whether the additionally selected test patterns included in additionally selected test pattern set 35 detect the first weighted undetected faults included in the first weighted undetected fault list 310b. Among the first undetected faults, detected faults by the fault simulation and the first detected faults included in the first detected fault list 30a are merged and saved in the fault list file 2 as a final weighted detected fault list 30c. In contrast, among the first undetected faults, faults remain undetected by the fault simulation are saved in the fault list file 2 as a final weighted undetected fault list 30d. The fault simulation module 21 calculates a weighted fault coverage D by the following equation (6).

$$D = W_d/W_a \qquad (6)$$

Here $W_d$ is the total weight added to the all final weighted detected faults and $W_a$ is the total added weight of all faults (excluding redundant ones).

The data transfer bus 11 shown in FIG. 1 is connected to an input unit 9 and an output unit 10 through an I/O controller 8. The input unit 9 is designed to enter data and instructions in the processing unit 1. A keyboard, a mouse and a readable memory device such as a flexible disc readable device are available for the input unit 9. The output unit 10 is designed to output the result of the selecting test patterns. A display device and a printer and an external memory device are available for the output unit 10.

A computer implemented method for selecting test patterns according to an embodiment of the present invention is described below with reference to FIG. 4.

(A) In S01, the first test pattern selecting module 20 shown in FIG. 1 selects the verification patterns with a high functional verification coverage or a high fault coverage from the verification pattern set 320 and defines the selected verification patterns as the selected test pattern set 33. The selected test pattern set 33 is saved in the test pattern file 3. The first test pattern selecting module 20 defines simultaneously unselected verification patterns as the unselected test patterns. The unselected test pattern set 34 is also saved in the test pattern file 3.

(B) In S02, the processing unit 1 accesses the gate level net 38 and the fault simulation module 21 generates faults estimated to occur in the logic circuit. The undetected fault list 300 including the generated faults is saved in the fault list file 2. The processing unit 1 continually accesses the basic cell library 160 and the gate level net 38 and the fault simulation module 21 simulates whether each selected test pattern included in the selected test pattern set 33 detects the faults included in the undetected fault list 300. The first undetected fault list 310a including first undetected faults that are undetected by the simulation is saved in the fault list file 2.

(C) In S03, the processing unit 1 accesses the layout information 36 and the layout parameter information 65 and the weighting module 23 adds the weight to the first undetected faults included in the first undetected fault list 310a. The first weighted undetected fault set is saved in the fault list file 2 as the first weighted undetected fault list 310b.

Thereafter, the fault sampling module 24 extracts the second undetected faults from the first weighted undetected faults included in the first weighted undetected fault list 310b with the extraction probability proportional to the added weight in S04. The second undetected fault list 31 extracted at random is also available.

(D) In S05, the processing unit 1 accesses the basic cell library 160 and the gate level net 38 and the fault simulation module 21 simulates whether each unselected test pattern included in the unselected test pattern set 34 detects the second undetected faults on the second undetected fault list 31. Detected faults by each unselected test pattern are saved in the fault list file 2 as the additionally detected fault list by each of unselected test patterns 32.

(E) In S06, the second test pattern selecting module 26 selects the additionally selected test patterns that detects complementarily the second undetected faults from each other from the unselected test pattern set 34 based on a criterion of the added weight. The additionally selected test patterns are saved in the test pattern file 3 as the additionally selected test pattern set 35. A detailed procedure to select the additionally selected test patterns in S06 is described below with reference to FIG. 5.

(F) In S07, the processing unit 1 shown in FIG. 1 accesses the basic cell library 160 and the gate level net 38 and the fault simulation module 21 simulates whether each additionally selected test pattern included in the additionally selected test pattern set 35 detects the first weighted undetected faults included in the first weighted undetected fault list 310b. The final weighted detected fault list 30c, the final weighted undetected fault list 30d and the weighted fault coverage of the logic circuit are outputted as a result of the simulation.

In the method for selecting test patterns according to an embodiment of the present invention, extracting the second undetected fault list 31 by the fault sampling module 24 in S04 is designed to reduce CPU resources required to execute the fault simulation. The fault simulation time is roughly proportional to the volume of the extracted fault list. To some extent, a low extraction rate in S04 is expected to maintain the reliability on the fault coverage in S07 since the selected test pattern set 33 extracted by the first test pattern selecting module 20 in S01 is almost equivalent to the verification pattern set 320 in the functional verification coverage. However, a fault list with an extremely low rate extraction induces a decrease of the reliability on the fault coverage of additional selected test patterns selected in S06, which may not achieve a required fault coverage in the manufacturing tests. An appropriate rate of extraction may be determined with reference to the experimental database.

Figure 4:
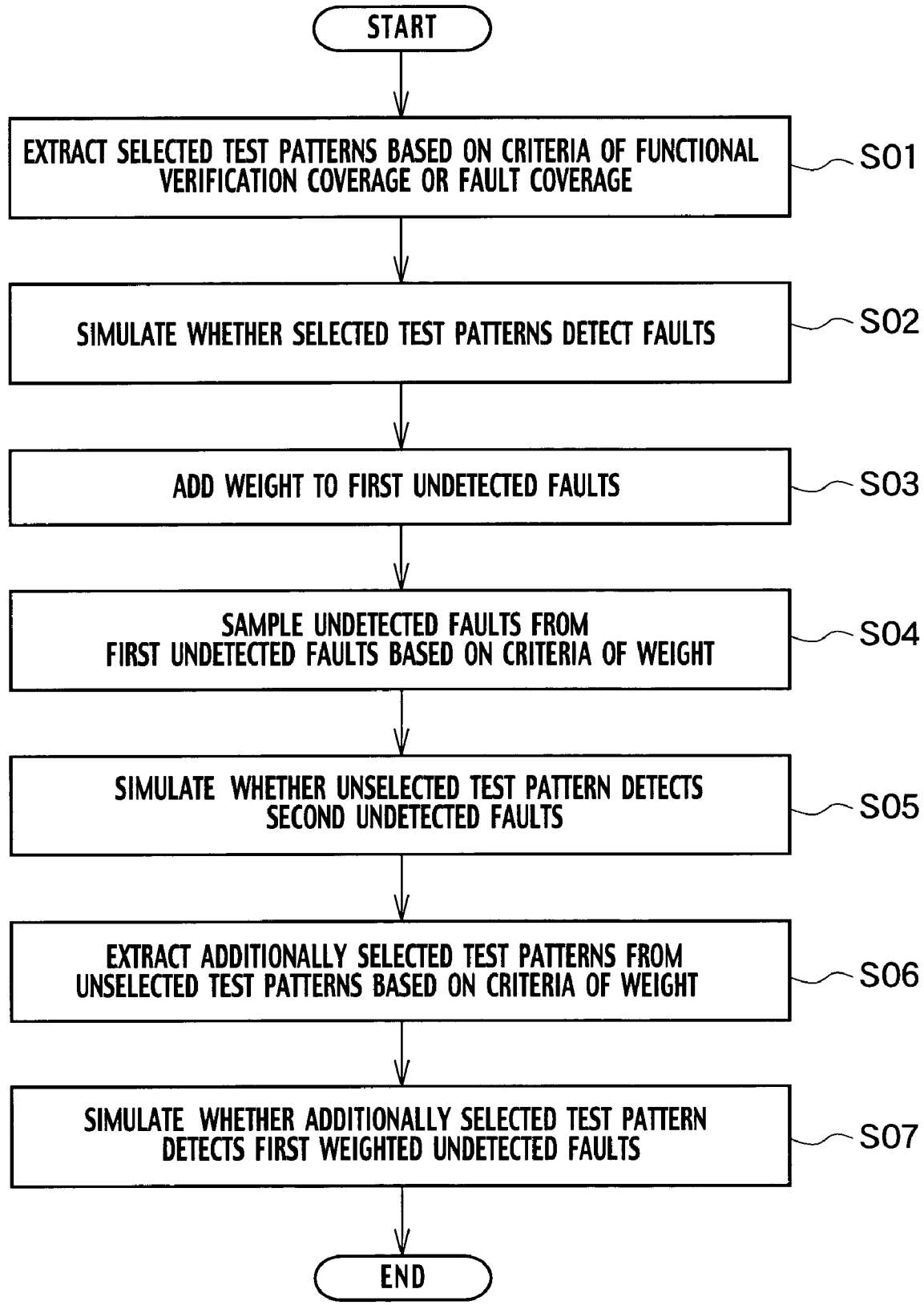
FIG. 4 is a flow chart of a method for selecting test patterns in accordance with an embodiment of the present invention.
Figure 5:
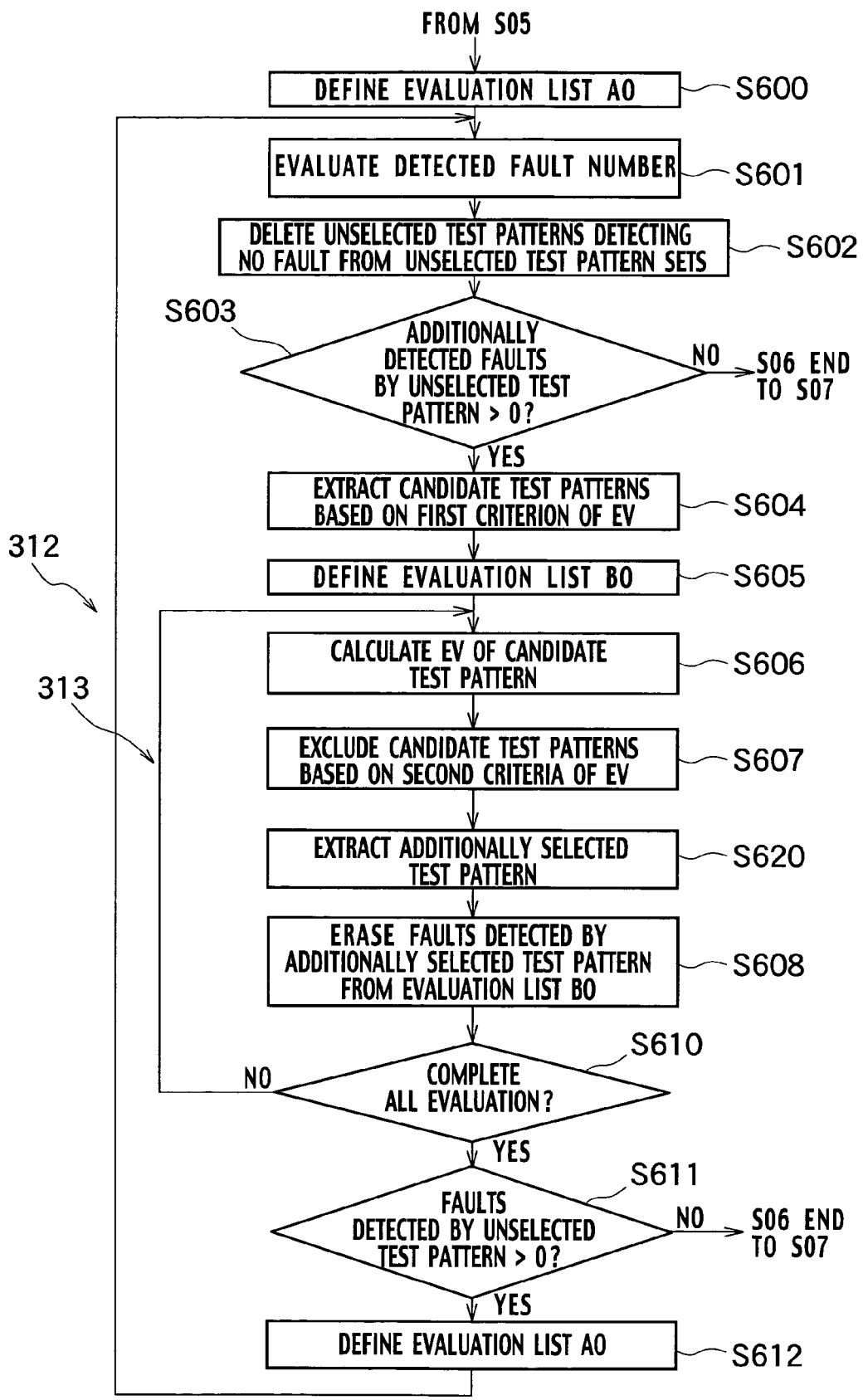
FIG. 5 is a flowchart of a method for extracting an additionally selected test pattern shown in S06 of FIG. 4 in accordance with an embodiment of the present invention.

With reference next to FIG. 5, a detailed procedure of S06 shown in FIG. 4 is described below.

(a) After accomplishing S05 shown in FIG. 4, the additionally detected fault number evaluating module 51 shown in FIG. 3 defines the second undetected fault list 31 shown in FIG. 1 as the evaluation list A0 in S600. In S601, the additionally detected fault number evaluating module 51 shown in FIG. 3 accesses the evaluation list A0 and the additionally detected fault list by each unselected test pattern 32 shown in FIG. 1 and evaluates the number of faults included in the evaluation list A0 which are detected by each unselected test pattern included in the unselected test pattern set 34.

(b) In S602, the additionally detected fault number evaluating module 51 shown in FIG. 3 erases unselected test patterns that detect few or no faults, or also deletes unselected test patterns by which all detected faults that are given a weight of 0 or nearly 0 from a temporary test pattern set copied from the unselected test pattern set 34 shown in FIG. 1. Subsequently, the candidate test pattern selecting module 52 shown in FIG. 3 accesses the temporary test pattern set and surveys the existence of the unselected test patterns that detect faults and the existence of at least one unselected test pattern by which detected faults are given an added weight of effective (non-0 or non-nearly 0) value in S603. In case such unselected test patterns exist, S604 is the next procedure. Otherwise, S07 shown in FIG. 4 is the next procedure.

(c) In S604, the candidate test pattern selecting module 52 shown in FIG. 3 accesses the additionally detected fault lists by unselected test patterns 32 and the evaluation list A0 and selecting information file 7 and calculates the EV of each unselected test pattern included in the temporary test pattern set. The candidate test pattern selecting module 52 shown in FIG. 3 extracts the unselected test patterns fulfilling the first criterion of the EV given by the equation (4) as the candidate test patterns from the temporary test pattern set 34. Thereafter, a candidate test pattern of the maximum EV value is defined as the best pattern. The EV is calculated by the equations (1)–(3).

(d) In S605, the candidate test pattern selecting module 52 defines the evaluation list A0 as the evaluation list B0. Thereafter, the additionally selected test pattern selecting module 53 evaluates the EV of each candidate test pattern by the equations (1)–(3) in S606. Though the EV value of each candidate test pattern calculated in the first processing is equal to the value calculated in S604, the EV value is a different value after the second processing through loop 313.

(e) In S607, the additionally selected test pattern selecting module 53 excludes from the processing the candidate test patterns failing to fulfill the second criterion given by the equation (5). In S620, the additionally selected test pattern selecting module 53 defines a candidate test pattern of the maximum EV value as the additionally selected test pattern. The additionally selected test pattern extracted from the candidate test patterns is added to the additionally selected test pattern set 35 shown in FIG. 1. In the case all candidate test patterns are excluded from processing in S607, the S620 is skipped over.

(f) In S608, the additionally selected test pattern selecting module 53 shown in FIG. 3 erases among the second undetected faults detected faults by the additionally selected test pattern from the evaluation list B0. In the case all candidate test patterns are excluded from processing in S607, the S608 is skipped over. Subsequently, the additionally selected test pattern selecting module 53 verifies the existence of the candidate test patterns for processing in S610. In the case all candidate test patterns are excluded from processing in S607, S611 is the next procedure. Otherwise, S606 through loop 313 is the next procedure.

(g) In S611, the evaluation list defining module 55 accesses the temporary test pattern set and verifies the existence of the unselected test patterns that detect the faults and also verifies the existence of at least one undetected test pattern by which detected faults is given an added weight of effective (non-0 or non-nearly 0) value. In the case of existence of such unselected test patterns, S612 is the next procedure. Otherwise S07 shown in FIG. 4 is the next procedure. In S612, the evaluation list defining module 55 shown in FIG. 3 defines the evaluation list B0 as the evaluation list A0. After S612, S601 is the next procedure through loop 312.

As described above, S06 shown in FIG. 4 is designed to select the additionally selected test patterns based on the EV criterion through loop 312 shown in FIG. 5. In addition, though a plurality of redundant candidate test patterns that are equivalent in detecting similar fault models are possibly selected in S604 based on the first EV criterion, such redundant candidate test patterns are not selected as the additionally selected test patterns in S620, since the faults detected by the additionally selected test patterns are erased from the evaluation list B0 in S608 and the EV given by the equation (1) of each candidate test pattern is updated in S606 and such redundant candidate test patterns are excluded from processing in S607 through the loop 313.

The order of the method is not restricted to FIG. 4. For example, instead of carrying out S605 and then step S606, S606 may be carried out after S608. In addition, the above description discussed that S06 is terminated in S603 and S611 if all unselected test patterns detect few or no faults or faults t which weights of 0 or nearly 0 are given. However, this processing may increase substantial repetition of loop 312 and loop 313. In this case, if unselected test patterns that are not yet evaluated are estimated in total to contribute a fault coverage of less than 0.1%, terminating S06 is an alternative. In addition, if the minimum total number of the selected test patterns and additionally selected test patterns is required in manufacturing tests, extracting the all first undetected faults as the second undetected faults in S04 and extracting single candidate test pattern in S604 is also an alternative even though the alternative may require large CPU resources.

As described above, the apparatus for selecting test patterns and the computer implemented method for selecting test patterns according to an embodiment of the present invention make it possible to select the additionally selected test patterns that contribute to an increase of the fault coverage by referring to the weight of the layout information and do not require large CPU resources because smaller test pattern length is strongly preferred in the extraction of each additionally selected test pattern.

Figure 6:
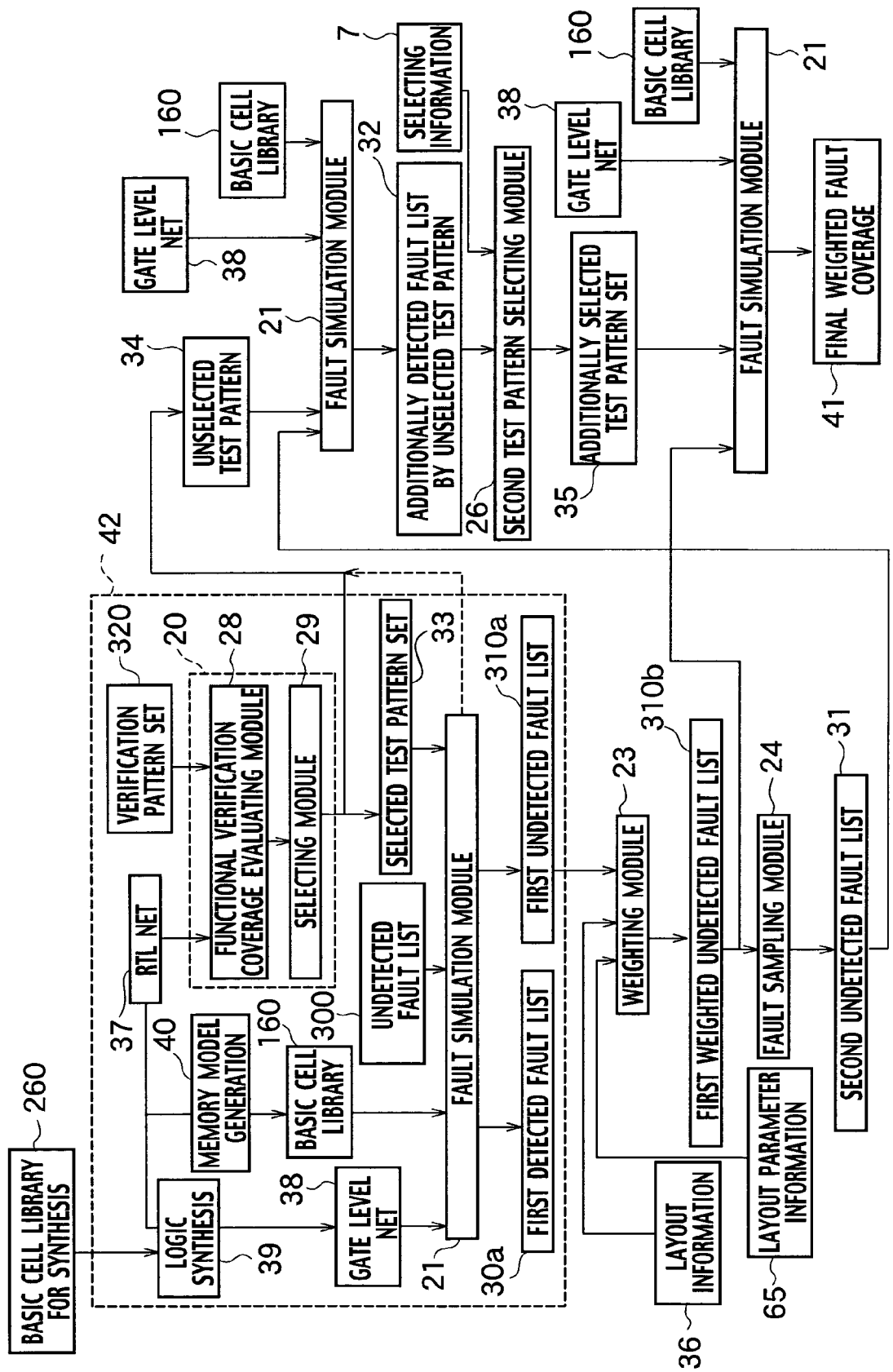
FIG. 6 is a data flow diagram of a method for selecting test patterns by using elements of an apparatus for selecting test patterns shown in FIG. 1 in accordance with an embodiment of the present invention.

FIG. 6 indicates the method for selecting test patterns with device elements and files of the apparatus for selecting test patterns shown in FIG. 1. The verification pattern set 320 and the RTL net 37 are entered in the functional verification coverage evaluating module 28 of the first test pattern selecting module 20 as shown in FIG. 6. The functional verification coverage (RTL code coverage) evaluating module 28 estimates functional verification coverage of each verification pattern included in the verification pattern set 320. The selecting module 29 defines the verification patterns with high functional coverage as the selected test pattern set 33. The selecting module 29 defines other verification patterns as the unselected test pattern set 34. The logic synthesis tool 39 accesses the RTL net 37 and basic cell library for synthesis 260 and generates the gate level net 38. The gate level net 38 includes information of the basic cell functions and of the connection nodes between the terminals of the LSI and the basic cells. In this case, a memory is not an object for the logic synthesis and remains as RTL description. Therefore, in a memory model generation 40 memory models are generated meeting specifications for the fault simulation module 21 and included as the basic cell library 160. Such memory models can be previously included in basic cell library 160. The selected test pattern set 33, the gate level net 38, the fault list 300 and the basic cell library 160 are entered into the fault simulation module 21. The fault simulation module 21 outputs the first detected fault list 30a and the first undetected fault list 310a. Usually these two fault lists are in one fault list output from the fault simulation module 21. Extracting the selected test patterns of which the increase of fault coverage is below designed criterion in the fault simulation and adding such selected test patterns failing to fulfill the criterion to unselected test pattern set 34 is an alternative.

The first detected and undetected faults included in the first undetected fault list 310a are entered into the weighting module 23 with the layout information 36 and the layout parameter information 65. The weighting module 23 outputs the first weighted undetected fault list 310b including the first weighted undetected faults. The first weighted undetected fault list 310b is entered into the fault sampling module 24. The fault sampling module 24 extracts the second undetected faults from the first weighted undetected faults by a criterion of the weight and outputs the second undetected fault list 31. The second undetected fault list 31, the unselected test pattern set 34, the gate level net 38 and the basic cell library 160 are entered into the fault simulation module 21. The fault simulation module 21 generates the additionally detected fault lists by unselected test patterns 32.

The additionally detected fault lists by unselected test patterns 32 and the selecting information file 7 are entered into the second test pattern selecting module 26. The second test pattern selecting module 26 outputs the additionally selected test pattern set 35. The additionally selected test pattern set 35, the first weighted undetected fault list 310b, the gate level net 38 and the basic cell library 160 are entered into the fault simulation module 21. The fault simulation module 21 outputs the final weighted fault coverage 41 and a final undetected fault list.

Figure 7:
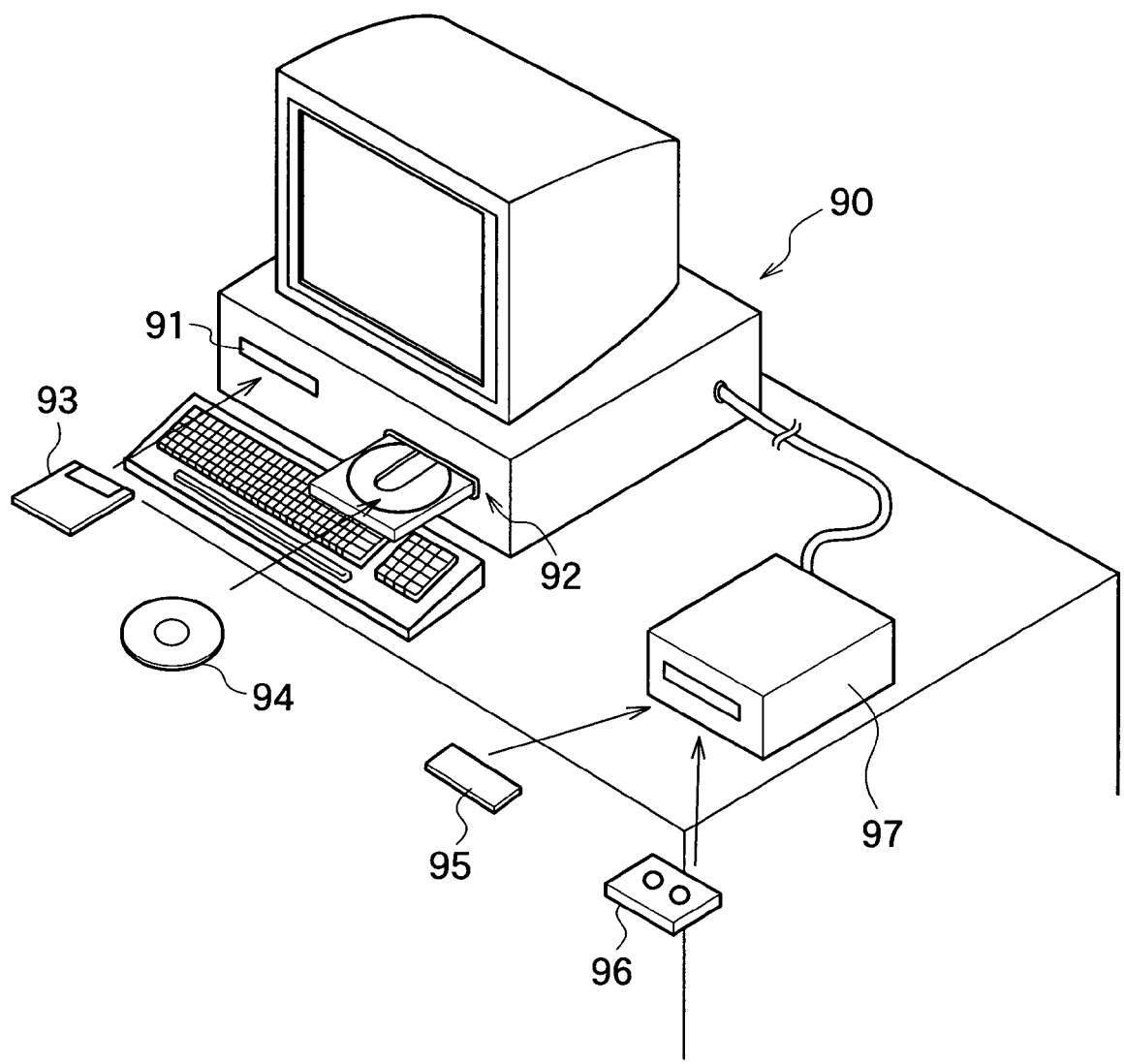
FIG. 7 is a diagram of a computer system so as to execute a method for selecting test patterns in accordance with an embodiment of the present invention.

The computer implemented method for selecting test patterns according to an embodiment of the present invention is capable of being expressed as descriptions of a series of processing or instructions for a computer system. Therefore, the method for selecting test pattern shown in FIG. 4 is capable of being formed as a computer program product to execute multiple functions of the CPU in the computer system. "The computer program product" includes, for example, various writable mediums and storage devices incorporated or connected to the computer system. The writable mediums include a memory device, a magnetic disc, an optical disc and any devices that record computer programs. With reference to FIG. 7, the computer system 90 has a flexible disk drive 91 and a CD-ROM drive 92 in front. The computer program product as the flexible disk 93 or the CD-ROM 94 is inserted into each disk drive and executes the computer implemented method for selecting test pattern shown in FIG. 4 by the computer system 90. A ROM 95 as a semiconductor memory for example used for game cassette and a cassette tape 96 as a magnetic tape are also available for the computer program product by connecting a drive unit 97 to the computer system 90.

As described above, this embodiment of the present invention makes it possible to reduce the number of the test patterns effectively based on the fault coverage reflecting the layout information corresponding to the quality of the LSI chips and also makes it possible to extract the effective test patterns contributing to enhance the quality of the manufacturing tests from the verification patterns. Therefore, high quality manufacturing tests is maintained with fewer test patterns than former apparatus and method, which leads cost saving for the manufacturing tests.

OTHER EMBODIMENTS

Although the invention has been described above by reference to the embodiment of the present invention, the present invention is not limited to the embodiment described above. Modifications and variations of the embodiment described above will occur to those skilled in the art, in the light of the above teachings.

For example, though the EV is calculated by the equations (1)–(3) in the embodiment, the EV will be calculated in various ways as far as the EV reflects the added weight and step number. In addition, the fault sampling module 24 extracts the second undetected faults from the first weighted undetected fault list 310*b* with the extraction rate proportion to the added weight correlating to the layout elements in the embodiment described above. In contrast, arranging the weighted faults in order of the added weight and extracting the second undetected fault one by one to generate the second undetected fault list 31 until the total value of the added weight fulfills a criterion given by the following equation (7) with the fault sampling module 24 is an alternative. In this case, all faults that are given large added weight are included to the procedure to extract the additionally selected test patterns, which increases a reliability of the method for selecting test patterns.

$$X = W_h / W_a \quad (7)$$

Here, $W_h$ is the total added weight that is given to the extracted faults and $W_a$ is the total added weight that is given to all faults.

Further, though the first test pattern selecting module 20 has the functional verification coverage 28 and the selecting module 29 in the embodiment described above, the invention is not limited to such form. For example, extracting faults of the LSI at random with the first test pattern selecting module 20 in advance and simulating whether the selected test patterns detect the extracted faults by the fault simulation module 21 and selecting the selected test patterns contributing to increase the fault coverage is an alternative. In this case, procedure to avoid selecting redundant test patterns shown in S06 of FIG. 5 is still useful. Extracting the selected test patterns by an experienced designer or operator based on how the verification patterns inspect the logic circuit and what the verification patterns detect is also an alternative.

Entering the faults detected by every selected test pattern in the second test pattern selecting module 26 and outputting reduced selected test patterns and the first undetected fault list 310*a* and the first weighted undetected fault list 310*b* is another embodiment of the invention. In this manner, a test pattern of which step size is minimum is exctracted in the first selection, therefore, each step size of the selected test patterns becomes small.

As described above, the present invention includes many variations of embodiments. Therefore, the scope of the invention is defined with reference to the following claims.

What is claimed is:

1. An apparatus for selecting test patterns comprising:
   a first test pattern selecting module configured to classify a plurality of verification patterns of a logic circuit of an LSI into a plurality of selected test patterns fulfilling a reliability criterion and a plurality of unselected test patterns failing to fulfill the reliability criterion;
   a fault simulation module configured to simulate whether the plurality of selected test patterns and the plurality of unselected test patterns detect a plurality of faults estimated to occur in the logic circuit;
   a weighting module configured to add weight reflecting a plurality of layout elements of the logic circuit and information on each name of the plurality of layout elements to each of a plurality of first undetected faults that are undetected by the plurality of selected test patterns and define the plurality of first undetected faults to which the weights are given as a plurality of first weighted undetected faults;
   a fault sampling module configured to extract a plurality of second undetected faults from the plurality of first weighted undetected faults;
   a second test pattern selecting module configured to extract a plurality of additionally selected test patterns that detects the plurality of second undetected faults from the plurality of the unselected test patterns based on a criterion of the added weight; and
   a data memory configured to store a plurality of final weighted undetected faults from among the plurality of first weighted undetected faults, the plurality of final weighted undetected faults being not detected by the plurality of additionally selected test patterns.

2. An apparatus for selecting test patterns comprising:
   a first test pattern selecting module configured to classify a plurality of verification patterns of a logic circuit of an LSI into a plurality of selected test patterns fulfilling a reliability criterion and a plurality of unselected test patterns failing to fulfill the reliability criterion;
   a fault simulation module configured to simulate whether the plurality of selected test patterns and the plurality of unselected test patterns detect a plurality of faults estimated to occur in the logic circuit;
   a weighting module configured to add weight reflecting a plurality of layout elements of the logic circuit to each of a plurality of first undetected faults that are undetected by the plurality of selected test patterns and define the plurality of first undetected faults to which the weights are given as a plurality of first weighted undetected faults;
   a fault sampling module configured to extract a plurality of second undetected faults from the plurality of first weighted undetected faults; and
   a second test pattern selecting module configured to extract a plurality of additionally selected test patterns that detects the plurality of second undetected faults from the plurality of the unselected test patterns based on a criterion of the added weight,
   wherein the second test pattern selecting module further comprises:
   a candidate test pattern selecting module configured to select a plurality of candidate test patterns that detect the plurality of second undetected faults from the plurality of unselected test patterns based on a first criterion of an evaluation value reflecting the added weight among the plurality of second undetected faults of detected faults by each of the plurality of unselected test patterns and a pattern length of each of the plurality of the unselected test patterns; and
   an additionally selected test pattern selecting module configured to exclude from processing the plurality of candidate test patterns failing to fulfill a second criterion of the evaluation value and select an additionally selected test pattern by which the evaluation value is a maximum from the plurality of candidate test patterns and exclude from processing among the plurality of second undetected faults detected faults by the additionally selected test pattern and update the evaluation value, the additionally selected test pattern being one of the plurality of additionally selected test patterns.

3. A computer implemented method for selecting test patterns comprising:
   classifying a plurality of verification patterns of a logic circuit of an LSI into a plurality of selected test patterns fulfilling a reliability criterion and a plurality of unselected test patterns failing to fulfill the reliability criterion;

simulating whether the plurality of selected test patterns detects a plurality of faults estimated to occur in the logic circuit;

adding a weight reflecting a plurality of layout elements of the logic circuit and information on each name of the plurality of layout elements to each of a plurality of first undetected faults that are undetected by the plurality of selected test patterns and defining the plurality of first undetected faults to which the weights are added as a plurality of first weighted undetected faults;

extracting a plurality of second undetected faults from the plurality of first weighted undetected faults based on an extracting condition;

simulating whether the plurality of unselected test patterns detects the plurality of second undetected faults;

selecting a plurality of additionally selected test patterns that detects the plurality of second undetected faults from the plurality of the unselected test patterns based on a criterion of the added weight; and listing a plurality of final weighted undetected faults among from the plurality of first weighted undetected faults, the plurality of final weighted undetected faults being not detected b the plurality of additionally selected test patterns.

4. The computer implemented method of claim 3, wherein the reliability criterion is a functional verification coverage.

5. The computer implemented method of claim 3, wherein the reliability criterion is a coverage of the plurality of faults.

6. The computer implemented method of claim 3, wherein the extracting condition is a random sampling.

7. The computer implemented method of claim 3, wherein the extracting condition is a value proportional to the added weight.

8. A computer implemented method for selecting test patterns comprising:

classifying a plurality of verification patterns of a logic circuit of an LSI into a plurality of selected test patterns fulfilling a reliability criterion and a plurality of unselected test patterns failing to fulfill the reliability criterion;

simulating whether the plurality of selected test patterns detects a plurality of faults estimated to occur in the logic circuit;

adding a weight reflecting a plurality of layout elements of the logic circuit to each of a plurality of first undetected faults that are undetected by the plurality of selected test patterns and defining the plurality of first undetected faults to which the weights are added as a plurality of first weighted undetected faults;

extracting a plurality of second undetected faults from the plurality of first weighted undetected faults based on an extracting condition;

simulating whether the plurality of unselected test patterns detects the plurality of second undetected faults; and selecting a plurality of additionally selected test patterns that detects the plurality of second undetected faults from the plurality of the unselected test patterns based on a criterion of the added weight, wherein selecting the plurality of additionally selected test patterns further comprises:

selecting a plurality of candidate test patterns that detect the plurality of second undetected faults from the plurality of unselected test patterns based on a first criterion of an evaluation value reflecting the added weight among the plurality of second undetected faults of detected faults by each of the plurality of unselected test patterns and a pattern length of each of the plurality of the unselected test patterns; excluding from processing the plurality of candidate test patterns failing to fulfill a second criterion of the evaluation value;

extracting an additionally selected test pattern by which the evaluation value is a maximum from the plurality of candidate test patterns, the additionally selected test pattern being one of the plurality of additionally selected test patterns; and excluding from processing among the plurality of second undetected faults detected faults by the additional selected test pattern and updating the evaluation value.

9. A computer program product for controlling a computer system so as to select test patterns, the computer program product comprising:

a recording medium readable by the computer system;

instructions recorded on the recording medium for directing the computer system to classify a plurality of verification patterns of a logic circuit of an LSI into a plurality of selected test patterns fulfilling a reliability criterion and a plurality of unselected test patterns failing to fulfill the reliability criterion; instructions recorded on the recording medium for directing the computer system to simulate whether the plurality of selected test patterns detects a plurality of faults estimated to occur in the logic circuit;

instructions recorded on the recording medium for directing the computer system to add a weight reflecting a plurality of layout elements of the logic circuit and information on each name of the plurality of layout elements to each of a plurality of first undetected faults that are undetected by the plurality of selected test patterns and define the plurality of first undetected faults to which the weights are added as a plurality of first weighted undetected faults;

instructions recorded on the recording medium for directing the computer system to extract a plurality of second undetected faults from the plurality of first weighted undetected faults based on an extracting condition;

instructions recorded on the recording medium for directing the computer system to simulate whether the plurality of unselected test patterns detects the plurality of second undetected faults;

instructions recorded on the recording medium for directing the computer s system to select a plurality of additionally selected test patterns that detects the plurality of second undetected faults from the plurality of the unselected lest patterns based on a criterion of the added weight; and instructions recorded on the recording medium for directing the computer system to list a plurality of final weighted undetected faults from among the plurality of first weighted undetected faults, the plurality of final weighted undetected faults being not detected by the plurality of additionally selected test patterns.

10. The computer program product of claim 9, wherein the reliability criterion is a functional verification coverage.

11. The computer program product of claim 9, wherein the reliability criterion is a coverage of the plurality of faults.

12. The computer program product of claim 9, wherein the extracting condition is a random sampling.

13. The computer program product of claim 9, wherein the extracting condition is value proportional to the added weight.

14. A computer program product for controlling a computer system so as to select test patterns, the computer program product comprising:

a recording medium readable by the computer system;

instructions recorded on the recording medium for directing the computer system to classify a plurality of verification patterns of a logic circuit of an LSI into a plurality of selected test patterns fulfilling a reliability criterion and a plurality of unselected test patterns failing to fulfill the reliability criterion;

instructions recorded on the recording medium for directing the computer system to simulate whether the plurality of selected test patterns detects a plurality of faults estimated to occur in the logic circuit;

instructions recorded on the recording medium for directing the computer system to add a weight reflecting a plurality of layout elements of the logic circuit to each of a plurality of first undetected faults that are undetected by the plurality of selected test patterns and define the plurality of first undetected faults to which the weights are added as a plurality of first weighted undetected faults;

instructions recorded on the recording medium for directing the computer system to extract a plurality of second undetected faults from the plurality of first weighted undetected faults based on an extracting condition;

instructions recorded on the recording medium for directing the computer system to simulate whether the plurality of unselected test patterns detects the plurality of second undetected faults; and instructions recorded on the recording medium for directing the computer system to select a plurality of additionally selected test patterns that detects the plurality of second undetected faults from the plurality of the unselected test patterns based on a criterion of the added weight, wherein the second extracting instructions further comprises:

instructions recorded on the recording medium for directing the computer system to extract a plurality of candidate test patterns that detect the plurality of second undetected faults from the plurality of unselected test patterns based on a first criterion of an evaluation value reflecting the added weight among the plurality of second undetected faults of detected faults by each of the plurality of unselected test patterns and a pattern length of each of the plurality of the unselected test patterns;

instructions recorded on the recording medium for directing the computer system to exclude from processing the plurality of candidate test patterns failing to fulfill a second criterion of the evaluation value;

instructions recorded on the recording medium for directing the computer system to select an additionally selected test pattern by which the evaluation value is a maximum from the plurality of candidate test patterns, the additionally selected test pattern being one of the plurality of additionally selected test patterns; and instructions recorded on the recording medium for directing the computer system to exclude from processing among the plurality of second undetected faults detected faults by the additional selected test pattern and update the evaluation value.

* * * * *